United States Patent [19]

Himics et al.

[11] 4,286,050
[45] Aug. 25, 1981

[54] METHOD OF EXPOSING AND DEVELOPING A HOMOPOLYMER RESIST

[75] Inventors: Richard J. Himics, Trumbull, Conn.; Michael Kaplan, Franklin Township, Mercer County; Nitin V. Desai, Somerset, both of N.J.

[73] Assignee: RCA Corporation, New York, N.Y.

[21] Appl. No.: 171,050

[22] Filed: Jul. 22, 1980

Related U.S. Application Data

[62] Division of Ser. No. 959,847, Nov. 13, 1975.

[51] Int. Cl.³ .......................... G03C 5/00; G03C 1/71
[52] U.S. Cl. .................................... 430/296; 430/270; 430/275; 430/311; 430/313; 427/35; 427/36; 430/286; 430/325; 204/159.16
[58] Field of Search .............. 430/270, 296, 275, 311, 430/313; 427/35, 36

[56] References Cited

U.S. PATENT DOCUMENTS

| | | | |
|---|---|---|---|
| 3,842,051 | 10/1974 | Himics | 260/78.5 E |
| 3,885,964 | 5/1975 | Nacci | 204/159.18 |
| 3,951,657 | 4/1976 | Recchia et al. | 430/286 |
| 4,079,159 | 3/1978 | Sano et al. | 428/213 |
| 4,098,984 | 7/1978 | Turner | 526/245 |
| 4,143,225 | 3/1979 | Turner | 528/220 |

*Primary Examiner*—Jack P. Brammer
*Attorney, Agent, or Firm*—Birgit E. Morris; Edward J. Sites

[57] ABSTRACT

Homopolymers of 1-aza-5-acryloxymethyl-3,7-dioxabicyclo[3.3.0]octane are useful as resists for recording information patterns having high sensitivity and excellent contrast between exposed and unexposed areas.

7 Claims, 2 Drawing Figures

METHOD OF EXPOSING AND DEVELOPING A HOMOPOLYMER RESIST

This is a division of application Ser. No. 959,847, filed Nov. 13, 1978.

This invention relates to novel radiation recording media. More particularly, this invention relates to recording media for recording information with radiation including light, electron beams or x-rays, which media have excellent resolution and high sensitivity.

BACKGROUND OF THE INVENTION

Photoresists are recording media which are sensitive to light and are well known. Such media, when exposed to a light pattern, change their solubility characteristics in those areas struck by the light. When contacted with a suitable solvent after exposure, the more soluble portions dissolve leaving the less soluble portions in the form of a relief pattern. Negative photoresists are initially soluble in the developer solvent and the exposed portions become less soluble. Positive photoresists are initially insoluble in the developer solvent and the exposed portions become more soluble.

Recently, suitable modulated electron beams and x-ray beams have been utilized for recording information. Electron beams, because they can be more highly focussed than light beams, can record information at higher resolution or density. X-rays, which are diffracted less than ultraviolet light and scattered less than electrons, also have potential for increased resolution of information. With the increasing miniaturization of electronic devices, there is a continuing need for additional light, electron beam and x-ray resists that have high sensitivity and resolution for making patterned surfaces.

SUMMARY OF THE INVENTION

We have found that homopolymers of 1-aza-5-acryloxymethyl-3,7-dioxabicyclo[3.3.0]octane are excellent negative working photo-, electron beam and x-ray resists.

DETAILED DESCRIPTION OF THE INVENTION

Figure 1:
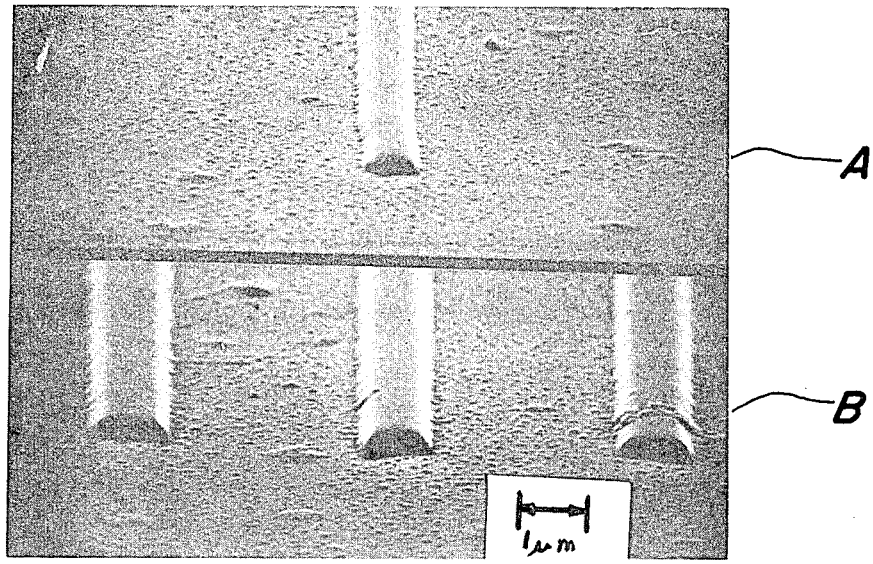
FIGS. 1 and 2 are photomicrographs of developed information-containing patterns from the present resists.

The homopolymers found useful as resists according to the present invention are polymers derived from the corresponding ester having the formula

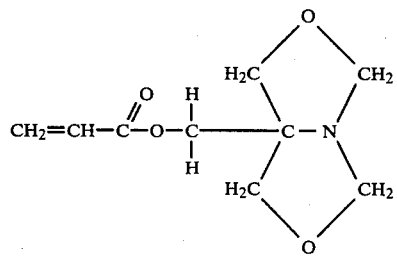

The monomers have been described in detail in U.S. Pat. No. 3,842,051.

The monomer can be polymerized in the presence of a free radical initiator at elevated temperatures. Free radical initiators are well known and include peroxides such as lauroyl peroxide, benzoyl peroxide, t-butyl perbenzoate, t-butyl hydroperoxide, t-butyl peracetate and the like, and azo initiators such as azobisisobutyronitrile and the like. Typically the initiators are added in amounts of from about 0.01 to 0.3 gram per mol of the monomer.

The polymerization process is preferably carried out in an inert liquid medium such as benzene, ethylenedichloride, chloroform and the like.

The temperature during polymerization is preferably above room temperature to about 60° C. At higher temperatures cross linking may occur which renders the resultant polymer insoluble and thus unsuitable for the present purpose.

The molecular weight of the resultant polymer is not critical, but in general higher molecular weight polymers exhibit improved sensitivity in resist formulations than do lower molecular weight polymers. Higher molecular weight polymers may be obtained by decreasing the initiator concentration, or by fractionating the polymer and reserving the higher molecular weight fractions for use as a resist according to the invention. The addition of a monomer which is known to enhance negative working resist sensitivity, such as glycidyl methacrylate, can also improve the sensitivity of the present resists.

In preparing the recording media of the invention, the purified polymer is solution cast or spun onto a desired support. The nature of this support is conventional and can be flexible such as a polyester tape, or inflexible such as a glass plate: and transparent or opaque, depending on the nature of the recording system in which it is to be employed. The concentration of the polymer and the solvent, which can be for example chloroform or ethylenechloride, is adjusted so as to deposit a film of a desired thickness onto the support. The solvent is then removed in any conventional manner, as by drying, evaporating and the like.

In the event the resist is to be employed as an electron beam resist, an electrically conductive layer is also required to remove the charge after electron beam exposure. If the support is non-conducting, a thin conductive film may be applied either to the support prior to coating with the resist, or applied to the surface of the resist itself. This conductive film can be conductive coated glass, such as tin oxide or indium oxide coated glass or glass having a conductive metal film thereon, or, alternatively, an electron permeable conductive layer can be formed on the polymer film by vapor deposition of a thin film of copper, nickel copper aluminum alloy, chromium or other conductive metal or alloy in known manner. The conductive layer is suitably from about 50–10,000, preferably 100–1000, angstroms in thickness.

The recording media comprising the homopolymer film on a support is ready for exposure to a patterned light beam, or to a light beam or x-rays through a mask, or to a modulated light beam or electron beam. Although the exact mechanism of recording is not known, it is believed that the homopolymer further cross-links during exposure to radiation, decreasing the solubility of the polymer that has been exposed to the radiation.

After recording the recording medium is developed by immersing in or spraying with a suitable solvent or solvent mixture containing a solvent and a nonsolvent. Very fast working solvents can be diluted with a nonsolvent if desired to decrease the rate of solution and avoid undue dissolution of the exposed portions of the resist. The particular solvents employed are not generally critical and can be determined empirically. Chloroform or chloroformmethylcyclohexane mixtures are suitable.

The time required for development or dissolution of the unexposed polymer is not critical and can vary up to about 30 minutes depending on the molecular weight of the polymer, the solvent employed and the depth of the relief pattern desired. The optimum time for development of each solvent mixture can be optimized by one skilled in the art by a series of test runs.

The invention will be further illustrated by the following Examples but it is to be understood that the invention is not meant to be limited to the details described therein. In the Example, parts and percentages are by weight unless otherwise noted.

EXAMPLE

Part A

1-Aza-5-acryloxymethyl-3,7-dioxabicyclo[3.3.0]-octane prepared according to Example 1 of U.S. Pat. No. 3,842,051 was recrystallized from hexane.

The monomer (3.5 parts) and 0.02 part of azobisisobutyronitrile were charged to a vessel under dry nitrogen in 60 parts by volume of dichloroethane. The vessel was closed and the contents heated carefully at 60° C. for about 16 hours. The precipitate was collected, filtered and dried.

The weight average molecular weight of the resultant polymer was 32,500 and the dispersity was 1.9.

Part B

The polymer obtained from Part A was dissolved in chloroform to form a 6 percent solids solution. Films were prepared by spin coating onto $\frac{1}{2} \times \frac{1}{2}$ inch (1.27×1.27 centimeters) glass plates coated with a 200 angstrom thick layer of chromium and a 2000 angstrom thick layer of nickel and dried in air.

The films were exposed to the beam of a scanning electron microscope at an accelerating potential of 5 kV and a beam current of 3 nA. An approximately Gaussian shaped beam having a full width at $\frac{1}{2}$ amplitude of about 0.4 micron was scanned to describe rasters on the surface of the films at various speeds of from 2.5–50 cm/second, thereby avarying the total exposure of the films to the beam.

Good resist raster patterns were obtained by developing with mixtures of chloroform and methylcyclohexane containing from 66.6 percent of chloroform at development times of about 30 seconds. FIG. 1 illustrates the resultant rasters obtained at 10,000 magnification. The photomicrograph designated as "A" was scanned at 10 cm/sec. (about 6.7 $\mu C/cm^2$) exposure and the photomicrograph designated as "B" was scanned at 2.5 cm/sec. (about 26 $\mu C/cm^2$ exposure).

Part C

Figure 2:
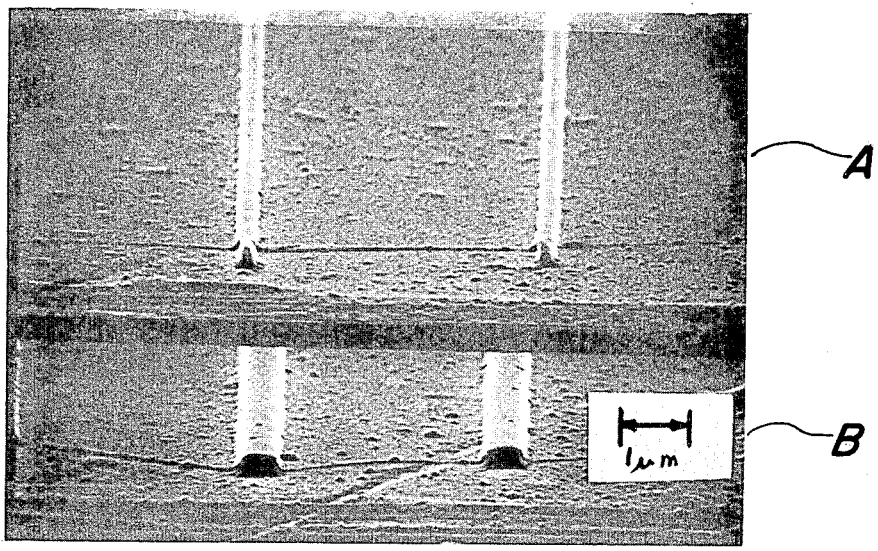

Excellent resist patterns were also obtained at 6.7 and 26 $\mu C/cm^2$ using a mixture of equal volumes of orthodichlorobenzene and methylene chloride as the developer solvent and developing for 5 minutes. FIG. 2 shows the developed rasters at a magnification of 10,000 times wherein the photomicrograph designated at "A" was scaned at 10 cm/sec. and "B" was scanned at 2.5 cm/sec.

We claim:

1. In a method of recording information whereby a resist material is exposed to radiation, said resist material becoming more insoluble in a developer solvent where impinged upon by the radiation and the resist material is developed with the developer solvent so as to remove the soluble portions thereof, the improvement which comprises employing as the resist material a film consisting essentially of a homopolymer of 1-aza-5-acryloxymethyl-3,7-dioxabicyclo[3.3.0]octane.

2. A method of recording information according to claim 1 wherein said radiation is a modulated light beam.

3. A method of recording information according to claim 1 wherein said radiation is a modulated electron beam.

4. A method according to claim 1 wherein the resist material is exposed to said radiation through a mask.

5. A method according to claim 4 wherein said radiation is ultraviolet light.

6. A method according to claim 4 wherein said radiation is x-rays.

7. A method according to claim 1 wherein the resist material is exposed to said radiation by scanning with a modulated information-containing beam of electrons.

* * * * *